United States Patent [19]

Gutierrez

[11] Patent Number: 5,602,482
[45] Date of Patent: Feb. 11, 1997

[54] TRAILER SYSTEMS TESTER

[76] Inventor: Alejandro Gutierrez, 201 S. 5th St., McAllen, Tex. 78501

[21] Appl. No.: 528,643

[22] Filed: Sep. 7, 1995

[51] Int. Cl.⁶ ..................................................... G01L 5/28
[52] U.S. Cl. ..................... 324/504; 324/503; 340/431; 73/129
[58] Field of Search ..................... 324/504, 133, 324/509, 556; 340/458, 431; 73/129

[56] References Cited

U.S. PATENT DOCUMENTS

| | | |
|---|---|---|
| 3,663,939 | 5/1972 | Olsson . |
| 3,737,767 | 6/1973 | Slutsky . |
| 4,547,722 | 10/1985 | Sarlo . |
| 4,586,370 | 5/1986 | Massender ............................ 324/504 |
| 4,750,354 | 6/1988 | Knestel . |
| 4,866,390 | 9/1989 | Butchko ............................ 324/504 |
| 5,095,276 | 3/1992 | Nepil . |
| 5,132,664 | 7/1992 | Feldmann et al. . |
| 5,251,967 | 10/1993 | Eberling . |
| 5,287,085 | 2/1994 | Smith . |

FOREIGN PATENT DOCUMENTS 3149115  6/1983  Germany .

*Primary Examiner*—Kenneth A. Wieder
*Assistant Examiner*—Jose M. Solis
*Attorney, Agent, or Firm*—Richard C. Litman

[57] ABSTRACT

A portable diagnostic device for checking electrical signalling systems of road going trailers. The device has several receptacles for connection to a corresponding receptacle or pin connector of most types of trailers. An electrical circuit includes switches for energizing individual signalling or illumination circuits of the trailer individually, and indicating lamps for annunciating circuit operability. The device, which is contained on a wheeled cart, has its own power supply and circuit overcurrent protective devices, and is thus independent of a tractor which normally generates the signals. The device enables a shop to perform a safety check for many varieties of trailers, while remaining independent of the tractor vehicles associated with the trailers.

16 Claims, 4 Drawing Sheets

TRAILER SYSTEMS TESTER

BACKGROUND OF THE INVENTION

1. Field of the Invention

The present invention relates to a testing and annunciation device for verifying operation of the signalling system of a towed trailer. In addition, the device has provision for testing the pneumatic brakes of the trailer. The device is contained within a small wheeled cart, and enables certain electrical and mechanical systems to be monitored independently of a towing vehicle being hooked up to the trailer. The cart is maneuvered, connected, and operated manually by one person.

2. Description of the Prior Art

Freight hauling trailers drawn by over the road tractors are equipped with many signalling and safety features. Illuminated signalling lamps include brake lights, turn signals, and running lights. Safety features also include pneumatic braking systems. Trailers must be inspected periodically for operability of these signalling and safety systems. Other types of trailers such as utility trailers, recreational trailers and horse trailers also have signal lighting systems that must be periodically tested.

One way of testing and observing the systems is to connect a towing vehicle such as a tractor to the trailer. A tractor has the voltage and pneumatic sources for operating the systems. An observer can activate the various systems individually, then observe the results. This method can be quite inefficient, since it relies upon the presence of an unused tractor, and also requires time to make connections and carry out the cumbersome process of manually activating each system, then walking around the trailer to verify proper performance.

A tractor may not be available for such duty when it would be convenient to perform the safety check. A smaller and less expensive device for taking the place of the tractor would serve well as a replacement, and a number of such devices are proposed in the prior art.

U.S. Pat. No. 3,663,939, issued to Hans Olsson on May 16, 1972, discloses a device insertable in series into the combined wiring of a tractor and its trailer. This device requires the presence of a tractor, and does not cooperate with pneumatic or hydraulic systems.

A small diagnostic device which is directly plugged into a socket integral with a trailer is shown in U.S. Pat. No. 3,737,767, issued to Robert Slutsky on Jun. 5, 1973. This device is usable only with vehicles having a seven-conductor plug. The device cannot test marker lights independently of tail lights, as can the present invention, and, because it dedicates only one indicator to turn signals, cannot readily monitor a four way flashing function.

U.S. Pat. No. 4,547,722, issued to Thomas J. Sarlo on Oct. 15, 1985, describes a diagnostic device mounted in a wheeled cart. This device is also limited to testing vehicles having the particular type of receptacle provided for.

A diagnostic device for testing braking systems is set forth in U.S. Pat. No. 4,70,354, issued to Anton Knestel on Jun. 14, 1988. This device requires rollers which contact the vehicle wheels. Rollers and monitoring of road wheels are not involved in the present invention.

A circuit for diagnosing operability of a trailer's electrical system is shown in U.S. Pat. No. 5,095,276, issued to James C. Nepil on Mar. 10, 1992. This circuit is considerably more complicated than that of the present invention, while not providing the versatility of the present invention.

The prior art devices are particularly intended for use with trailers for over the road tractor and trailer combinations, and have electrical interface components specifically found on such combinations. They lack the ability to be compatible with a variety of receptacles or electrical interface components. Also, the prior art devices having electrical diagnostic circuits have no provision for testing pneumatic braking systems.

None of the above inventions and patents, taken either singly or in combination, is seen to describe the instant invention as claimed.

SUMMARY OF THE INVENTION

The present invention provides a small, maneuverable, wheeled apparatus which an individual technician can connect to a freight trailer or other type of trailer for the purpose of analyzing or monitoring the trailer signalling systems. Most of these systems are electrical, and operate specified lamps. Other optional systems monitor pneumatic braking systems. The apparatus generates electrical signals for operating the various lamps on the trailer. Indicators provided on the apparatus indicate continuity of the various circuits, thus confirming operability of the trailer lamps.

Pneumatic systems on the trailer are monitored by pressurizing the pneumatic system, and audibly and visibly examining the trailer. This examination will detect leaks and failure to operate in the proper manner.

The novel signal testing device is specifically intended to be compatible with most over the road freight trailers, mobile homes, recreational trailers, horse trailers, and some smaller trailers, all of which have modular wiring connectors for connecting the electrical system of a towing vehicle to the electrical signalling system of the tractor. These wiring connectors are provided in a variety of dimensions and plug configurations, most of which are standardized and widely adopted. To this end, the novel device is provided with a plurality of corresponding modular wiring connectors which mate with corresponding connectors conventionally provided on different sizes and types of trailers.

A power supply is provided so that the device and the testing procedure are independent of a tractor. Overcurrent devices provide protection to the circuitry.

Flashers are provided to assist in identifying operation of lights which normally flash when operating, such as turn signals and the four-way alarm flasher. Additionally, the testing device has pneumatic couplings for testing the integrity of pneumatic braking systems.

Thus, a service shop having the novel testing device will be able to perform safety checks on most types of trailers brought in for service, without being dependent upon tractors or other corresponding towing vehicles for performing the safety checks.

Accordingly, it is a principal object of the invention to provide a mobile trailer systems tester, usable by a single person for performing safety checks on trailers.

An additional object of the invention is to provide a trailer systems tester which is readily compatible with different types of trailers.

It is another object of the invention to generate electrical signals, transmit the electrical signals to the illumination and signalling circuits of a trailer, and to employ the electrical signals to illuminate annunciator lamps.

It is a further object of the invention to provide a pneumatic control system to transmit air pressure to the pneumatic systems of a trailer, in order to observe operability of these systems.

Still another object of the invention is to generate electrical power signals for operating powered devices on a trailer.

An additional object of the invention is to protect the electrical circuitry from an overcurrent condition.

It is again an object of the invention to incorporate flashers into circuits for testing turn signals and four-way flashing lights.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
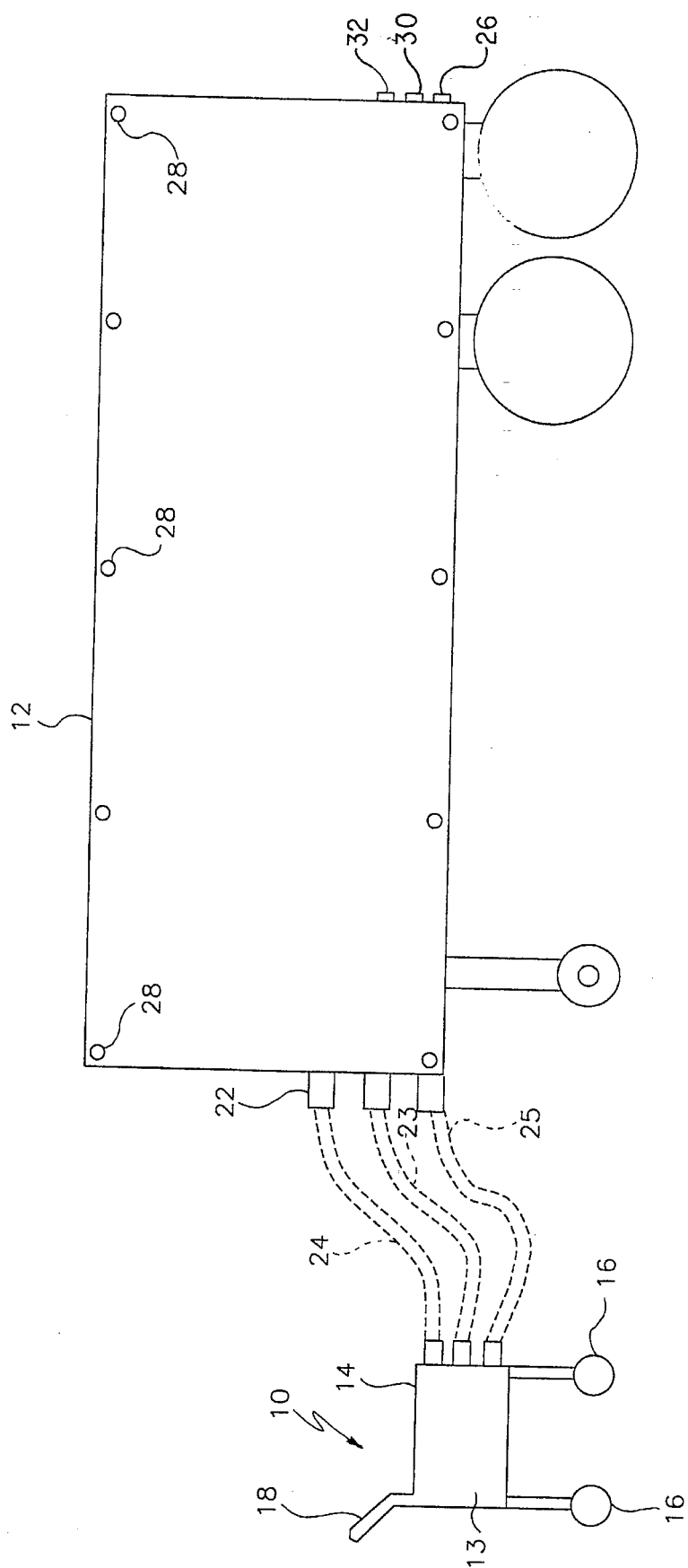
FIG. 1 is an environmental, side elevational view of the invention connected to a trailer.

The novel trailer systems tester 10 is seen in FIG. 1 connected to a trailer 12. Tester 10 comprises a cart 13 having a housing 14 enclosing electrical circuitry, wheels 16 supporting the cart, and a handle 18 for maneuvering the cart. This compact device enables tester 10 to be maneuvered into place, connected, and operated by one person.

Figure 3:
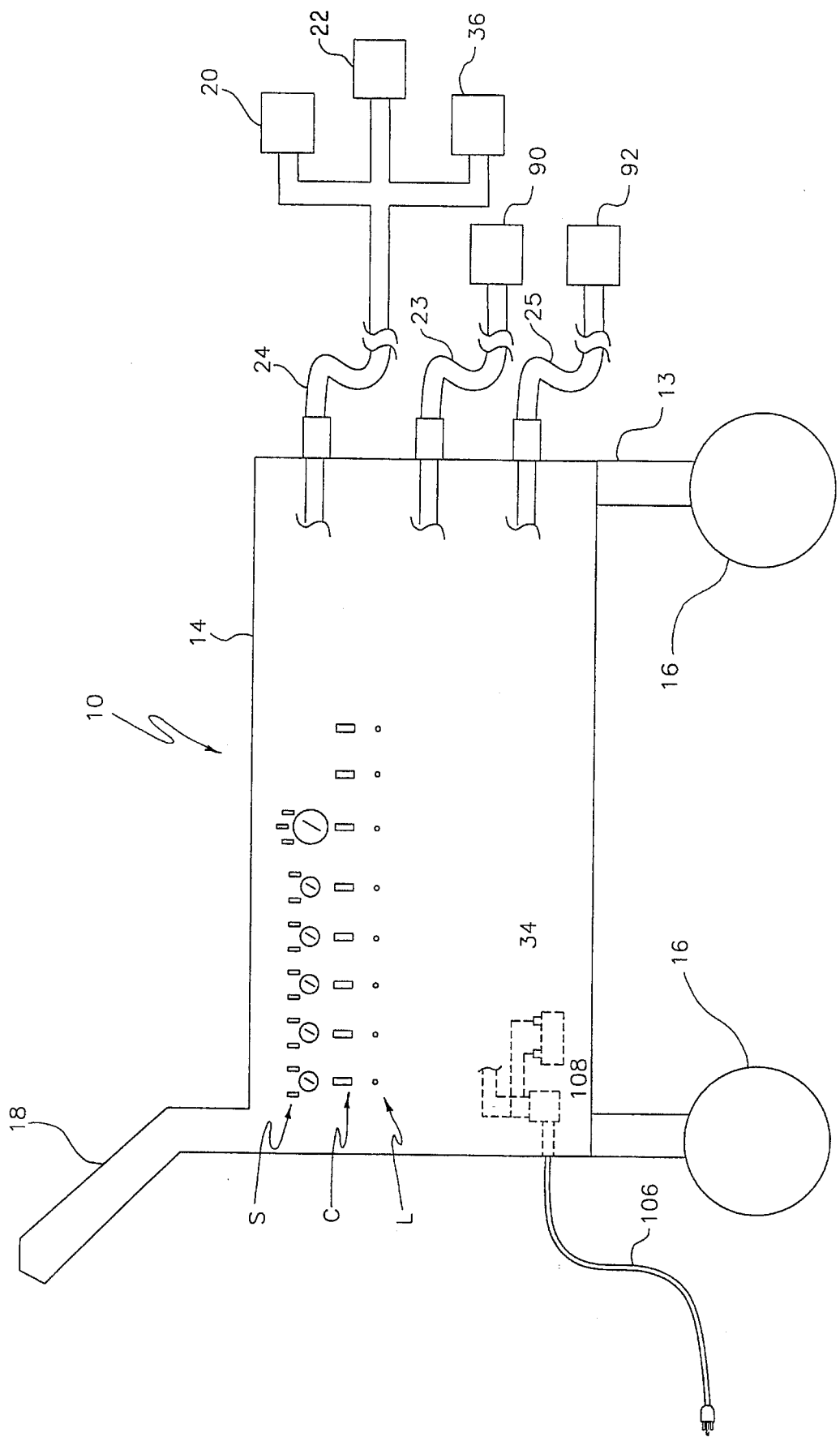
FIG. 3 is a large scale schematic view of the invention, showing details of the various connectors of the present invention.

Referring to FIGS. 1 and 3, tester 10 has a wiring bundle 24 which carries all the wiring necessary to energize and test the electrical systems of a trailer to each of three dissimilar wiring connectors 20, 22, and 36. Wiring connectors 20, 22, and 36 are selected from a number of standard varieties employed extensively in the transportation industry. Different or dissimilar connectors are provided so that tester 10 can be quickly connected to many of the various types of trailers in use today. For example, connector 20 can be a six-pin plug which fits the standard socket used for conducting electrical illumination signals from a towing vehicle (not shown) to horse trailers, heavy utility trailers, or trailer homes. Connector 22 can be a seven-pin plug which fits the standard socket used for conducting electrical illumination signals from a towing vehicle (not shown) to a freight hauling trailer. Connector 36 can be a four-pin plug which fits the standard socket used for conducting electrical illumination signals from a towing vehicle (not shown) to trailers used with passenger cars.

Although, in the illustrated example the dissimilar connectors are shown extending from the same wiring bundle 24, as an alternative, separate four-pin, six-pin, and seven-pin connectors can be provided on the front panel of the housing 14. Individual cables, each matching the pin numbers of a respective connector and each having appropriate types (in terms of male, female, etc.) of connectors at its two ends, can then be used to connect the respective connector to the corresponding type of trailer.

Pneumatic pressure hoses 23 and 25 also extends to trailer 12, the purpose of which will be explained hereinafter. The electrical connection enables testing of certain conventional circuits, including those operating tail lights 26, marker lights 28, brake or stop lights 30, and turn signals 32. In this view, both right and left turn signals are represented by the signal lights 3. Alarm indicating lamps, popularly known as four-way flashers, operate right and left signals simultaneously.

Once connected in the manner illustrated, individual circuits and systems are operated, and the results are noted. Tester 10 renders the tractor vehicle unnecessary for generating operating electrical and pressure signals.

Each type of connector 20 or 22 essentially duplicates those found on trailer towing vehicles and mates with matching female connectors on the trailer. A connector has terminals (see FIG. 2) for a plurality of individual conductors, each connected to a selected or predetermined illumination or signalling circuit of the trailer. Thus, each conductor of a given wiring connector corresponds to a predetermined function, illumination or signalling circuit. When connected, energization of a selected trailer circuit will also energize a selected subcircuit within tester 10. Standardization of connectors and even of correlation of location of individual terminals with respect to which function or illumination circuit is powered thereby, enables rapid connection and testing.

Figure 2:
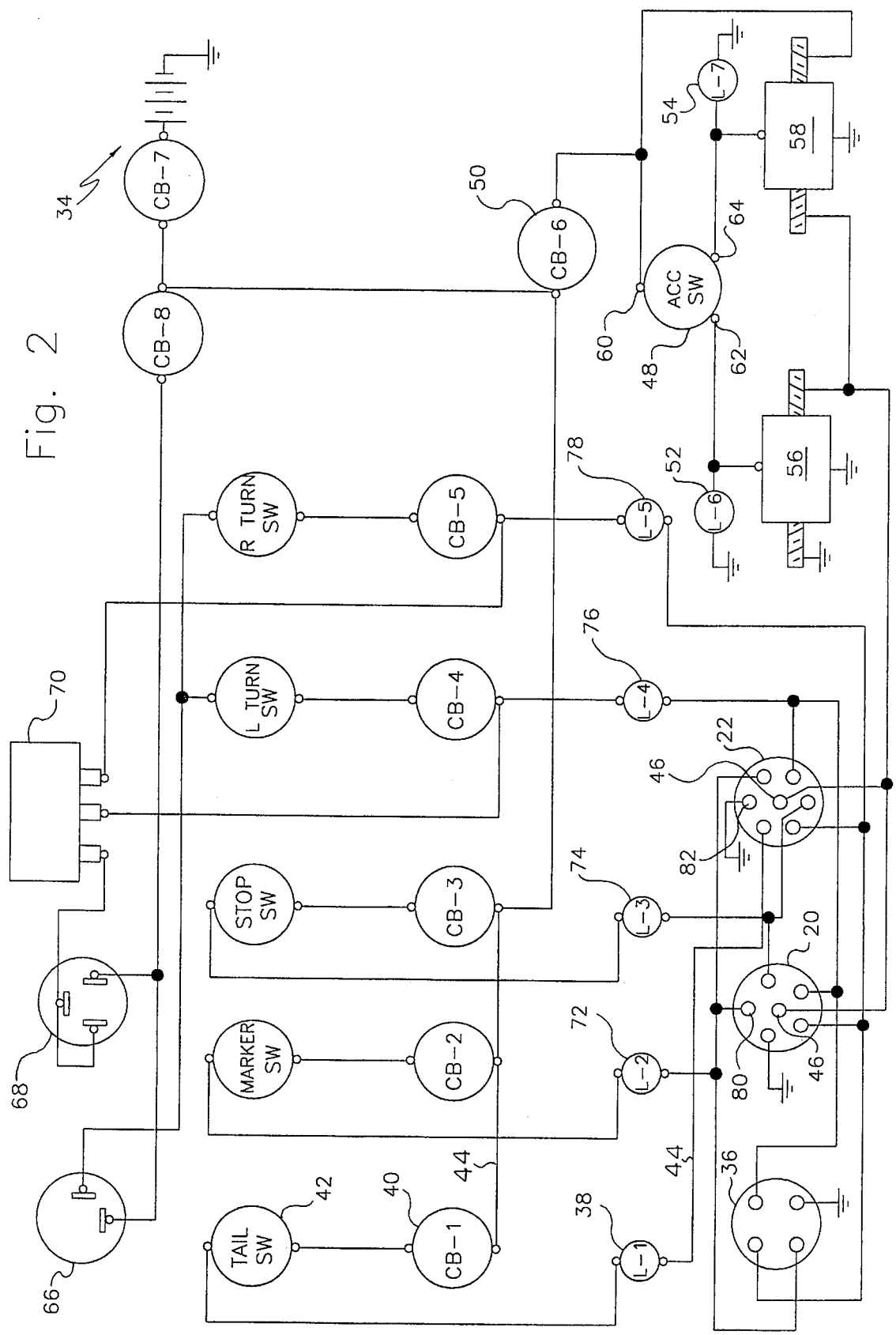
FIG. 2 is an electrical schematic drawing of the circuitry of the invention.

Electrical circuitry and components thereof which are disposed in or on housing 14 are shown in FIG. 2. Electrical circuitry includes a power source, such as battery 34, several subcircuits for testing individual illumination and signalling functions, and three modular wiring connectors 20,22,36.

A subcircuit is provided for each function to be tested. This arrangement is well known in the prior art, and components of subcircuits for testing each function will not be repetitively described. Subcircuits are provided to check the principal illumination and signalling functions set forth above, and a specialized subcircuit for providing power for miscellaneous or non-specific purposes.

A typical signalling and illumination circuit is shown at the left of FIG. 2, and includes annunciator lamp 38, circuit breaker 40, a two-position switch 42, and conductors 44 connecting these components to the rest of the circuitry. Visual annunciators are preferred, although the annunciator may be audible if desired. The overcurrent protective device is preferably a circuit breaker, since these are readily resettable, but may also be a fuse or fusible link, if desired. Any number or arrangement of overcurrent protective devices is possible at the discretion of the practitioner of the invention, the particular arrangement shown in this Figure being judged sufficient to protect all conductors.

Switch 42 closes and opens the circuit, thus selectively controlling its respective subcircuit.

Lamp 38 is responsive to successful energization of the circuit, and, when switch 42 closes the circuit, will illuminate if the corresponding circuit of the trailer is intact. If the circuit is defective, lamp 38 will remain extinguished.

All other subcircuits include respective lamps, circuit breakers, switches, and conductors making connection to power and extending the subcircuit to the appropriate terminal of the appropriate wiring connector 20,22, or 36.

It will be appreciated that certain signalling and illumination functions must be present on all road vehicles, and thus, certain functions are connected in parallel among wiring connectors 20,22,36. For example, all vehicles must have turn signals and running or marker lights, and appropriate terminals are all connected in common.

Six-conductor wiring connector 20 is typically employed with mobile homes, recreational trailers, and horse trailers. Seven-conductor wiring connector 22 are typically provided on large, over the road freight trailers. The electrical systems of these vehicles typically have positive conductors, indicated at terminals 46, which are connected in common.

No corresponding conductor is normally provided for small trailers, of the type normally drawn by a passenger automobile. Therefore, there is no corresponding terminal provided in wiring connector 36.

Thus, those terminals which serve similar purposes are connected in common at all wiring connectors. This arrangement confers immediate operability to tester 10 upon being plugged into the trailer electrical system. Obviously, electrical systems having more functions cannot be totally wired in common with those lacking certain functions.

The subcircuit defined by switch 48, circuit breaker 50, lamps 52 and 54, and solenoids 56 and 58 provides, selectively, continuity to positive and negative sides of battery 34. This enables less frequently encountered power accessories to be connected as is appropriate, and thereby tested. This feature may be employed to test such devices as electric brakes and winches.

Switch 48 is a three-position switch wherein one terminal is connected alternately and individually to the other two terminals. In this circuit, terminal 60 is in electrical communication with either terminal 62 or with terminal 64. Solenoids 56,58 are relays which operate in similar fashion to frequently employed engine starting solenoids, and are intentionally depicted to resemble such relays.

The electrical circuitry includes flashers 66,68,70 for operating flashing lights, such as turn signals and simultaneous four light alarm lights, in conventional manner. Flashers 66,68,70 are provided by employing, for twelve volt systems, model numbers 262, 263, and 552 of Signal-Stat division of Federal Mogul Corporation, of Detroit, Mich. These or equivalent flashers transmit an intermittent power signal to corresponding subcircuits, so that the subject lights may be readily identified due to their characteristic flashing. Four-way flasher 70 is connected to operate both right and left turn signals simultaneously, in accord with standard transportation industry practice. Of course, testing of these circuits may proceed without flashers, if so desired.

Remaining subcircuits 72,74,76,78, are identified in the schematic of FIG. 2 by their respective indicating lamps, but will be understood to include respective two-position switches and associated conductors operably connecting these switches to power and to corresponding terminals on wiring connectors 20,22,36. Obviously, each subcircuit completes a circuit to one type of signalling and illumination function on the trailer.

Wiring connectors 20,22,36 are preferred since they correspond to wiring conventions most frequently encountered in the transportation industry. Connector 22, having seven conductors arranged as shown, wherein the topmost terminal 82 corresponds to a topmost electrode of a tractor and trailer wiring system (not shown), is employed in large, over the road, freight hauling tractor and trailer combinations. Connector 20, topmost terminal 80 also corresponding to the topmost terminal of its trailer counterpart (not shown), is typical of wiring systems of mobile homes, recreational trailers, and horse trailers. Connector 36 is typical of connections for smaller, passenger car drawn trailers.

Figure 4:
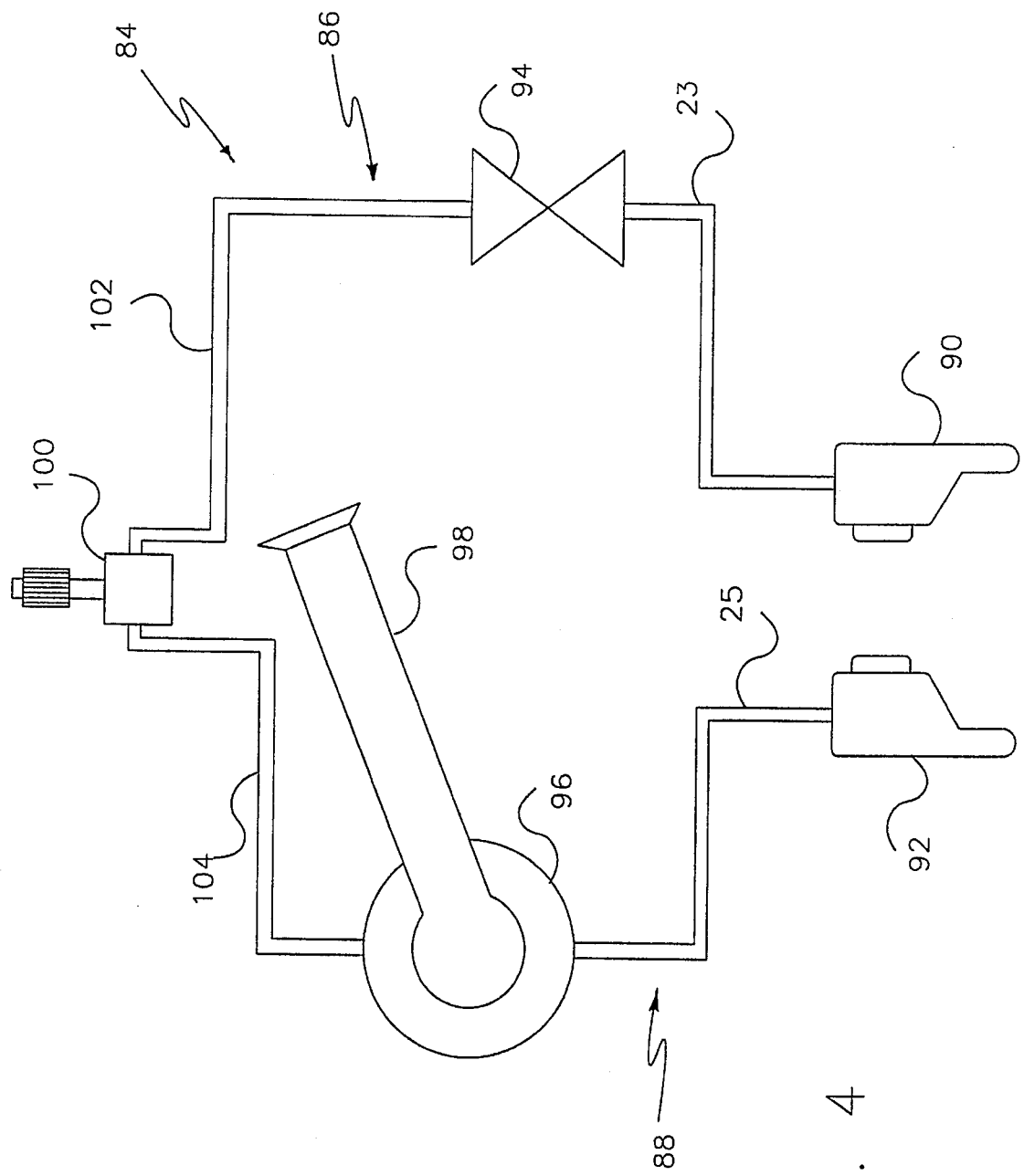
FIG. 4 is a schematic diagram of the pneumatic control system of the present invention.

For large trailers, additional testing features are provided. Referring now to FIGS. 3 and 4, a pneumatic system 84 for testing the pneumatic brakes of a heavy freight trailer is seen. The Pneumatic system 84 includes an emergency circuit 86 and a service circuit 88. Pneumatic system 84 is connected to a source of air pressure (not shown) by a quick detachable coupler 100. The air pressure source is preferably shop air provided by the service station's high pressure air supply. Alternatively, a compressor or a tank of compressed air (not shown) can be provided on the cart 13 itself to allow use of the cart independent of the shop air. The emergency circuit 86 includes a conduit 102 which conducts high pressure air to a push-pull button valve 94. Outlet of the valve 94 is connected to a "glad-hands" connector 90 via the pressure hose 23. The "glad-hands" connector is a type of connector well known in the art and will not be described in any detail here.

The service circuit 88 includes a conduit 104 which conducts high pressure air to a brake service valve 96. The brake service valve 96 has an actuating handle or lever 98. Outlet of the valve 96 is connected to a "glad-hands" connector 92 via the pressure hose 25. The entire assembly shown in FIG. 4 is housed on the cart 13.

When the trailer 12 is disconnected from the pneumatic system of the towing tractor, the wheels of trailer 12 are locked up by an emergency braking system (not shown) which is biased to lock up the wheels of the trailer when the pneumatic system of the trailer 12 (also not shown) is not pressurized. This feature is standard in heavy freight trailers, and prevents the trailer from rolling down inclined surfaces when the trailer 12 is disconnected from the towing tractor. In addition, when the pneumatic system of the trailer 12 is connected to the pneumatic system of the towing tractor, actuation of the tractor brake pedal causes the braking of the wheels of trailer 12.

The assembly of FIG. 4 simulates the pneumatic system of the towing tractor. In operation, the shop air supply is connected to the quick detachable coupler 100 with the cart 13 positioned in proximity to the trailer 12. Then the "glad-hands" connector 90 is connected to the emergency brake system of the trailer and the "glad-hands" connector 92 is connected to the pneumatic braking system of the trailer 12. At this time, opening valve 94 causes the pressurization of the emergency brake system of the trailer 12. Thus, the emergency braking system of the trailer, which is biased to be engaged in the absence of air pressure, is disengaged when the valve 94 is opened. This arrangement allows the functioning of the emergency brakes to be tested.

Also at this time, actuating the valve 96 using lever 98 simulates the pressing of the tractor brake pedal, and causes the pneumatic brakes of the trailer to be activated. In this manner, the functioning of the pneumatic brakes of the trailer can be tested.

Integrity of the pneumatic system can be ascertained by audible detection of leaks, by observation to determine whether the system holds pneumatic pressure, and by operational tests, if desired.

Some trailer pneumatic systems operate by vacuum. An optional vacuum system including a vacuum pump driven by a motor, and controlled by suitable valves and switches, can be provided on cart 13 to test such vacuum systems. Also as another option, a hydraulic testing system can be provided on the cart 13. Such a hydraulic testing system would include a reservoir for supplying hydraulic fluid, a hydraulic pump driven by a motor, suitable couplers and hoses for conducting hydraulic fluid under pressure to the hydraulic systems of the trailer, and suitable control switches and valves.

Switches S, circuit breakers C, and annunciating lamps L shown in the schematic of FIG. 2 are preferably mounted on the exterior of housing 14, so as to be readily visible and accessible. In addition, valve 96 is positioned in housing 14 in such a manner as to allow lever 98 to be readily accessible from the exterior of housing 14. Airhose-coupler 100 should also be positioned in housing 14 in such a manner as to allow the shop's air supply hose to be readily coupled to coupler 100 from the exterior of housing 14.

Tester 10 has a suitable power supply, which may comprise battery 34, and may also, if desired, include a suitable cord and plug 106 and AC-to-DC converter 108 to allow the AC shop current to be used to power the testing circuitry.

The novel tester 10 thus set forth enables safety checks of a trailer in the absence of the towing vehicle. It can be wheeled about by one person, and can be employed to perform checks on different types of trailers having pneumatic and electrical systems. The electrical and pneumatic systems of the tester 10 are readily compatible with those of the trailers.

It is to be understood that the present invention is not limited to the embodiments described above, but encompasses any and all embodiments within the scope of the following claims.

I claim:

1. A trailer systems tester for performing safety checks on trailer having illumination and signal lighting circuits by a single operator, comprising:

a cart supporting a housing, wheels supporting said cart, and a handle attached to the rear of said cart for maneuvering said cart;

said housing containing an electrical circuitry connected to an electrical power supply, and connected to two pneumatic hoses connectable to a source of compressed air by a glad-hands coupler;

said electrical circuitry connectable to and selectively energizing and annunciating illumination and signalling lighting circuits of the trailer;

said electrical circuitry having subcircuits, each serving a selected illumination and signalling lighting circuit;

each said subcircuit having a switch for selectively controlling its respective subcircuit an annunciator selected from a lamp and an audible element responsive to successful energization of each said subcircuit; and a plurality of dissimilar modular wiring connectors each having a plurality of conductors, each individual conductor corresponding to one illumination and signalling function of the trailer, individual conductors for each like illumination and signalling function of each said modular wiring connector being connected in parallel by said electrical circuitry to a predetermined said subcircuit, whereby like functions are energized and tested on trailers having different modular wiring connectors by a designated one said subcircuit.

2. The trailer systems tester according to claim 1, wherein said annunciator is a lamp.

3. The trailer systems tester according to claim 1, wherein said annunciator is an audible element.

4. The trailer systems tester according to claim 1, each said subcircuit further comprising an overcurrent protective device operably connected thereto.

5. The trailer systems tester according to claim 1, said electrical circuitry further comprising at least one flasher operably connected to at least one said subcircuit connected to a conductor corresponding to a turning signal circuit of the trailer, for transmitting an intermittent power signal to a corresponding said subcircuit of said trailer systems tester.

6. The trailer systems tester according to claim 1, further comprising a four way indicator operably connected to a said subcircuit connected to a conductor corresponding to both turning signal circuits of the trailer, for transmitting an intermittent power signal to corresponding said subcircuits of said trailer systems tester.

7. The trailer systems tester according to claim 1 said plurality of modular wiring connectors including a six-conductor modular wiring connector and a seven-conductor modular wiring connector, whereby said trailer systems tester is compatible with over the road freight trailers, mobile homes, recreational trailers, and horse trailers.

8. The trailer systems tester according to claim 7, said plurality of modular wiring connectors further comprising a four-conductor modular wiring connector, whereby said trailer systems tester is also compatible with small utility trailers.

9. A trailer systems tester for performing safety checks on trailers having illumination and signalling lighting circuits, comprising:

a cart having a housing, wheels supporting said cart, and a handle for maneuvering said cart and attached thereto, electrical circuitry enclosed within said housing, and connectable and corresponding to and selectively energizing and annunciating illumination and signalling lighting circuits of the trailer, further comprising an electrical power supply and subcircuits, each serving a selected illumination and signalling lighting circuit, each said subcircuit having a switch for selectively controlling its respective subcircuit, an overcurrent protective device, and an annunciator selected from a lamp and an audible element responsive to successful energization of each said subcircuit, each said switch, said overcurrent protective device, and said annunciator mounted on the exterior of said housing;

a four-conductor modular wiring connector, a six-conductor modular wiring connector and a seven-conductor modular wiring connector, whereby said trailer systems tester is compatible with small trailers, over the road freight trailers, mobile homes, recreational trailers, and horse trailers, each said modular wiring connector having a plurality of conductors, each individual conductor corresponding to one illumination and signalling function of the trailer, individual conductors for each like illumination and signalling function of each said modular wiring connector being connected in parallel by said electrical circuitry to a predetermined said subcircuit, whereby like functions are energized and tested on trailers having different modular wiring connectors by a designated one said subcircuit; and at least one pneumatic hose connected to a pressurized air source, extending from said housing, and terminating in a glad hand, whereby a pneumatic system of a trailer can be connected to and pressurized from said trailer systems tester.

10. A trailer systems tester for performing safety checks on trailers having illumination and signalling lighting circuits, comprising:

a cart having a housing, wheels supporting said cart, and a handle for maneuvering said cart and attached thereto, electrical circuitry enclosed within said housing, and connectable and corresponding to and selectively energizing and annunciating illumination and signalling lighting circuits of the trailer, further comprising an electrical power supply and subcircuits, each serving a selected illumination and signalling lighting circuit, each said subcircuit having a switch for selectively controlling its respective subcircuit, an overcurrent protective device, and an annunciator selected from a lamp and an audible element responsive to successful energization of each said subcircuit, each said switch, said overcurrent protective device, and said annunciator mounted on the exterior of said housing;

at least one pneumatic hose connected to a pressurized air source, extending from said housing, and terminating in a glad hand, whereby a pneumatic system of a trailer can be connected to and pressurized from said trailer systems tester; and a six-conductor modular wiring connector and a seven-conductor modular wiring connector, whereby said trailer systems tester is compatible with over the road freight trailers, mobile homes, recreational trailers, and horse trailers, each said modular wiring connector having a plurality of conductors, each individual conductor corresponding to one illumination and signalling function of the trailer, individual conductors for each like illumination and signalling function of each said modular wiring connector being connected in parallel by said electrical circuitry to a predetermined said subcircuit, whereby like functions are energized and tested on trailers having different modular wiring connectors by a designated one said subcircuit.

11. The trailer systems tester according to claim 10, said electrical circuitry further comprising at least one flasher operably connected to at least one said subcircuit connected to a conductor corresponding to a turning signal circuit of the trailer, for transmitting an intermittent power signal to a corresponding said subcircuit of said trailer systems tester, and a four-way indicator operably connected to a said subcircuit connected to a conductor corresponding to both turning signal circuits of the trailer, for transmitting an intermittent power signal to corresponding said subcircuits of said trailer systems tester.

12. The trailer systems tester according to claim 10, said modular wiring connectors further comprising a four-conductor modular wiring connector, whereby said trailer systems tester is also compatible with small trailers.

13. The trailer systems tester according to claim 10, wherein said annunciator is a lamp.

14. The trailer systems tester according to claim 9, wherein said annunciator is a lamp.

15. The trailer systems tester according to claim 9, wherein said annunciator is an audible element.

16. The trailer systems tester according to claim 10, wherein said annunciator is an audible element.

* * * * *